(12) United States Patent
Kim

(10) Patent No.: US 7,285,977 B2
(45) Date of Patent: Oct. 23, 2007

(54) IMPEDANCE CONTROL CIRCUITS AND METHODS OF CONTROLLING IMPEDANCE

(75) Inventor: Jong-Seok Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 112 days.

(21) Appl. No.: 11/165,394

(22) Filed: Jun. 24, 2005

(65) Prior Publication Data

US 2005/0285698 A1    Dec. 29, 2005

(30) Foreign Application Priority Data

Jun. 28, 2004   (KR) ...................... 10-2004-0049077

(51) Int. Cl.
*H03K 17/16*   (2006.01)
*H03K 19/003*   (2006.01)

(52) U.S. Cl. ................. 326/30; 326/32.33; 326/34

(58) Field of Classification Search ............ 326/26–28, 326/30–34, 87; 327/108–112
See application file for complete search history.

(56) References Cited

U.S. PATENT DOCUMENTS 6,469,539 B2 * 10/2002 Kim ............................ 326/30

6,570,402 B2    5/2003 Koo et al.

FOREIGN PATENT DOCUMENTS

| JP | 11-027132 | 1/1999 |
|---|---|---|
| KR | 2000-0002393 | 1/2000 |
| KR | 2002-0042093 | 6/2002 |
| KR | 2003-13983 | 2/2003 |
| KR | 2003-34237 | 5/2003 |
| KR | 10-2004-0004792 | 1/2004 |

OTHER PUBLICATIONS

Korean Office Action dated Apr. 27, 2006.

* cited by examiner

*Primary Examiner*—Anh Q. Tran
(74) *Attorney, Agent, or Firm*—Harness, Dickey & Pierce, P.L.C.

(57) ABSTRACT

A circuit for controlling impedance may include an impedance adjustment circuit and a control signal generation circuit. The impedance adjustment circuit may adjust an impedance value based on a control signal. The control signal generation circuit may provide the impedance adjustment circuit with a control signal that corresponds to one of an impedance value at a first clock cycle and an impedance value at a second clock cycle that approaches a target impedance.

20 Claims, 6 Drawing Sheets

IMPEDANCE CONTROL CIRCUITS AND METHODS OF CONTROLLING IMPEDANCE

PRIORITY STATEMENT

This application claims priority under 35 USC § 119 to Korean Patent Application No. 2004-49077, filed on Jun. 28, 2004 in the Korean Intellectual Property Office (KIPO), the contents of which are herein incorporated by reference in its entirety for all purposes.

BACKGROUND OF THE INVENTION

1. Field of the Invention

Example embodiments of the present invention relate to impedance control circuits and methods of controlling impedance.

2. Description of the Related Art

Related art semiconductor devices may be mounted on, for example, a board (e.g., a printed circuit board (PCB) flexible PCB, etc.). If an impedance of the board is different from that of the semiconductor device(s), data transmitted from the semiconductor devices to the board may become distorted.

A resistor may be positioned outside, and connected to the semiconductor device, and an impedance control circuit may be positioned within the semiconductor device to equalize the impedance of the output driver and the board. The impedance control circuit may be used to adjust the impedance of the resistor.

Figure 1:
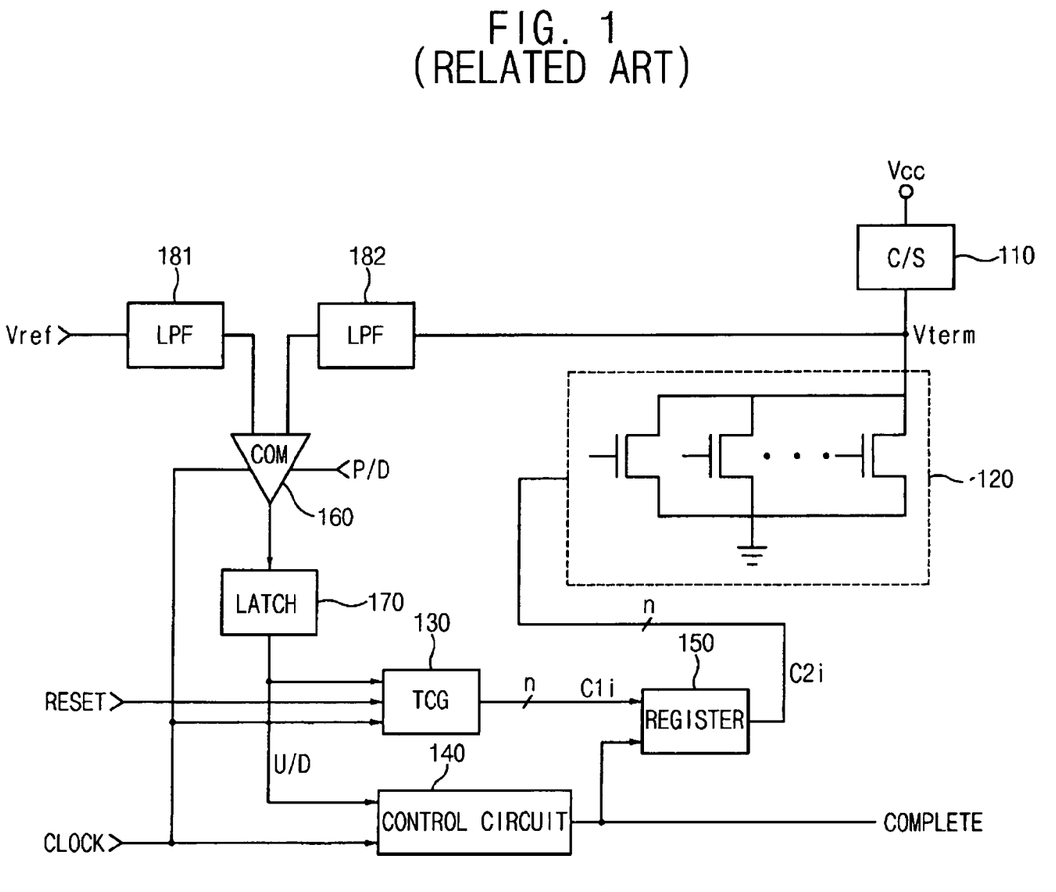
FIG. 1 is a block diagram illustrating a related art impedance control circuit.

FIG. 1 is a block diagram illustrating a related art impedance control circuit.

Referring to FIG. 1, the related art impedance control circuit may include a current source (C/S) 110, an impedance adjustment circuit 120, a comparator 160, a thermal code generator (TCG) 130, a control circuit 140, and a register 150.

The current source 110 may be installed in the semiconductor device and may provide a constant, or substantially constant, current level. The impedance control circuit 140 may include a plurality of transistors, which may be connected (e.g., serially connected) to the current source 110. Each gate of the transistors may be connected to the register 150 and the respective transistors may be turned on using data stored in the register 150 as a control signal.

The comparator 160 may compare a reference voltage Vref, generated by a voltage reference circuit (not shown), with a node voltage Vterm, generated at a node between the current source 110 and the impedance adjustment circuit 120, based on an operation mode signal P/D. The operation mode signal P/D may determine the operating mode of a circuit and a clock signal CLOCK.

The thermal code generator 130 may be initialized by a reset signal RESET and may generate a plurality of code values C1$i$ based on an output signal U/D of the comparator 160 and the clock signal CLOCK.

The control circuit 140 may receive the output signal U/D of the comparator 160 and the clock signal CLOCK, count a number of logic value transitions of the output signal U/D of the comparator 160, and generate a complete signal COMPLETE.

The register 150 may generate a plurality of code values C2$i$, for controlling the transistors in the impedance adjustment circuit 120, based on the code values C1$i$ and the complete signal COMPLETE.

The filters (e.g., low-pass filters) 181 and 182 may remove higher frequency signals in the node voltage Vterm and the reference voltage Vref.

The related art impedance control circuit may further include a latch circuit 170 when the comparator 160 is idle, for example, in response to the operating mode signal P/D, the latch circuit 170 may latch (e.g., store) the output of the comparator 160 for a period of time.

In operation of the related art impedance control circuit, the node voltage Vterm, between the current source 110 and the impedance adjustment circuit 120, may be compared with the reference voltage Vref, for example, based on the operating mode signal P/D output by the comparator 160. If the node voltage Vterm is lower than the reference voltage Vref, the comparator 160 may output a low logic signal 'L'. The register 150 may latch the code values C1$i$, which may be may be n bit binary values, generated by the thermal code generator 130.

The code values C2$i$ may be generated, based on the code values C1$i$, transmitted to the impedance adjustment circuit 120, the number of transistors turned on may be decreased (e.g., in response to the second code values C2$i$), and the impedance value of the impedance adjustment circuit 120 may be increased. This may increase the node voltage Vterm.

When the node voltage Vterm is greater than the reference voltage Vref, the comparator 160 may output a logic high signal 'H', and the register 150 may latch the code values C1$i$ generated by the thermal code generator 130.

The code values C2$i$ may be generated based on the code values C1$i$, transmitted to the impedance adjustment circuit 120, the number of transistors turned on may be increased (e.g., in response to the code values C2$i$), and the impedance value of the impedance adjustment circuit 120 may be decreased. This may decrease the node voltage Vterm.

The control circuit 140 may count the number of logic value transitions of the output signal U/D of the comparator 160, and determine a logic value for the control signals C2$i$ such that the node voltage approaches the reference voltage Vref.

Figure 2:
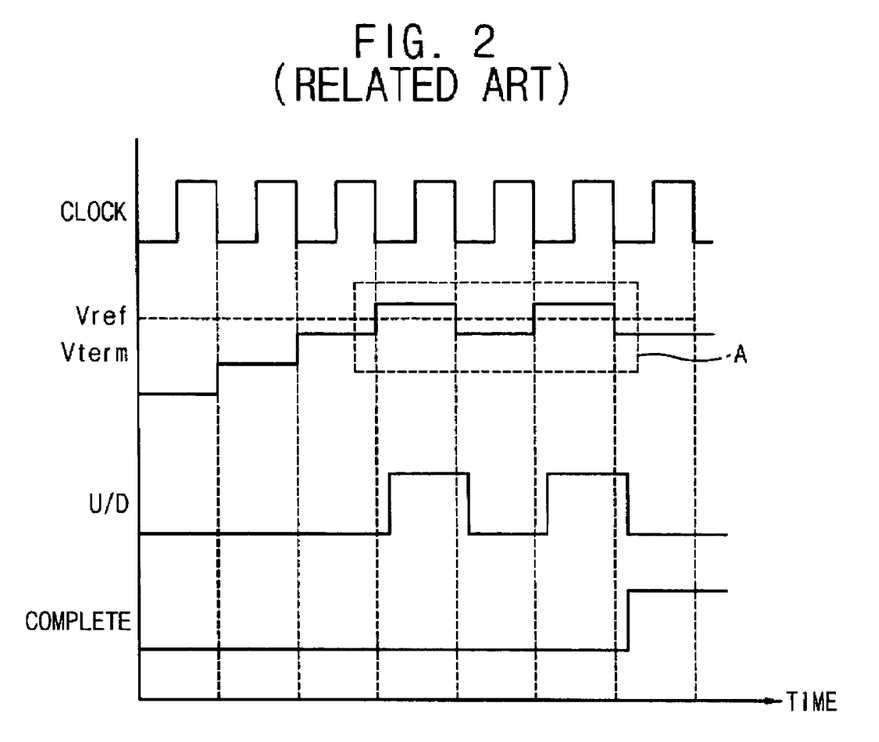
FIG. 2 is a waveform diagram illustrating signals of the related art impedance control circuit.

FIG. 2 is a waveform diagram illustrating signals of the related art impedance control circuit.

Referring to FIG. 2, when the output signal U/D of the comparator 160 has a low logic level 'L', the node voltage Vterm may increase (e.g., stepwise) each clock cycle until the output signal U/D transitions to a logic high signal 'H'. The output signal U/D may transition to the logic high signal 'H', and the node voltage Vterm may be reduced (e.g., stepwise) at the next clock cycle. When the change (e.g., increase or decrease) in the Vterm causes the logic level of output signal U)/D to transition (e.g., from 'L' to 'H' and/or 'H' to 'L'), for example, in consecutive clock cycles (e.g., continuously), the control circuit 140 may generate the complete signal COMPLETE after a period of time has elapsed.

An on-chip termination element, in an interface (e.g., a high-speed interface), may be coupled to input/output signal lines and may reduce signal reflection. When the on-chip termination element controls (e.g., digitally controls) impedance, a binary counter may be used for counting (e.g., up or down). The code value may vary repeatedly between a code value such that the node voltage Vterm approaching the reference voltage Vref may be generated, and the code value may increase or decrease, for example, by a binary value '1'.

Figure 3:
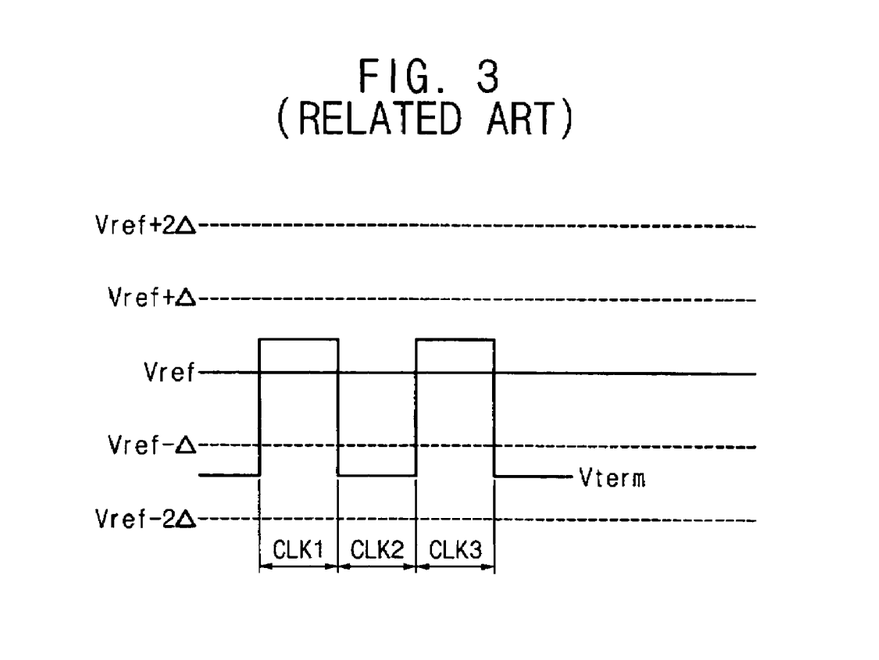
FIG. 3 is a waveform diagram illustrating a partially enlarged portion of A in the waveform diagram of FIG. 2.

FIG. 3 is a waveform diagram illustrating a partially enlarged portion of A in the waveform diagram of FIG. 2.

Referring to FIG. 3, the level of the node voltage Vterm may oscillate between a first level and a second level, and the node voltage Vterm may vary (e.g., asymmetrically) with the reference voltage Vref due to, for example, variations in process, temperature, voltage, etc. Since the node voltages Vterm at clock cycles CLK1 and CLK3 has a level closer to the reference voltage than the voltage level of the node voltage Vterm at a clock cycle CLK2, the node voltage at the clock cycle CLK1 or CLK3 may be selected as a termination voltage. In related art semiconductor devices, determining which voltage level between the first and second levels of the node voltage Vterm is output may not be pre-defined and any arbitrary one of the voltage levels may be output.

The node voltage Vterm closer to the reference voltage Vref may be selected, for example, by increasing the bit number of the code value by, for example, 1. However, a size of an NMOS transistor (e.g., W/L (width to length ratio) of the NMOS transistor) used for the impedance adjustment circuit and a termination resistor may be doubled and a chip size may be increased.

SUMMARY OF THE INVENTION

Example embodiments of the present invention provide a semiconductor device which may be less complicated and/or have reduced board size.

In an example embodiment of the present invention, a circuit for controlling impedance may include an impedance adjustment circuit and a control signal generating circuit. The impedance adjustment circuit may be adapted to adjust an impedance value based on a control signal. The control signal generating circuit may be adapted to provide the impedance adjustment circuit with the control signal corresponding to one of an impedance value at a first clock cycle and an impedance value at a second clock cycle that approaches a first impedance value.

In another example embodiment of the present invention, a method of controlling impedance may include adjusting an impedance value in response to a control signal, which may be based on an oscillation of a termination voltage at the adjusted impedance value relative to a reference voltage range at a previous clock cycle and a current clock cycle.

In another example embodiment of the present invention, a control circuit may include a code generating circuit, a delay circuit, and a code selecting circuit. The code generating circuit may compare a first reference voltage at the first impedance value with a termination voltage at an impedance value adjusted by a control signal to generate a code value corresponding to the control signal. The delay circuit may delay the code value generated from the code generating section by one clock cycle. The code selecting circuit may select the delayed code based on a comparison of the termination voltage with a second reference voltage and a third reference voltage. The code value my increase by one for each clock cycle that the termination voltage may be higher than the first reference voltage and decreases by one for each clock cycle that the termination voltage may be lower than the first reference voltage.

In another example embodiment of the present invention, a code selector for use in an impedance control circuit, may include a first selecting circuit, a second selecting circuit, and a logic circuit. The first selecting circuit may receive a first and second control signal and output a first selection signal. The second selecting circuit may receive the first and second control signals and output a second selection signal. The logic circuit may receive the first and second selection signals and output a code selection signal, which may be used to select one of a previous code signal and a current code signal for controlling an impedance value of a semiconductor device.

In example embodiments of the present invention, the second clock cycle occurs after the first clock cycle.

In example embodiments of the present invention, the control signal generating circuit may further include a code generating circuit and a code selecting circuit. The code generating circuit may be adapted to generate a code value based on a comparison of a first reference voltage at a first impedance value and a termination voltage at the adjusted impedance value. The code selecting circuit may be adapted to select a delayed code value based on a comparison of the termination voltage and a second reference voltage, and the termination voltage and the third reference voltage. In example embodiments of the present invention, the code value may increase by one for each clock cycle that the termination voltage may be higher than the first reference voltage and decreases by one for each clock cycle that the termination voltage may be lower than the first reference voltage.

In example embodiments of the present invention, the second and third reference voltages may be an upper threshold and a lower threshold, respectively, of a reference voltage range, and the code selecting circuit may select the delayed code value, for example, when the termination voltage at a previous clock cycle is within the reference voltage range and the termination voltage at a current clock cycle is out of the reference voltage range.

In example embodiments of the present invention, the second and third reference voltages may be an upper threshold and a lower threshold, respectively, of a reference voltage range, and the code selecting circuit may select the code value from the code generation circuit, for example, when the termination voltage at the previous clock cycle is out of the reference voltage range and the termination voltage at the current clock cycle is within the reference voltage range.

In example embodiments of the present invention, the code generating circuit may further include a first comparator, a latch circuit, and a counter. The first comparator may be adapted to compare the termination voltage with the first reference voltage. The latch circuit may be adapted to latch an output of the first comparator. The counter may be adapted to increase the code value by one, for example, when the termination voltage is higher than the first reference voltage and decrease the code value by one when the termination voltage is lower than the first reference voltage.

In example embodiments of the present invention, the code selecting circuit may further include a first comparator, a second comparator, and a code selector. The first comparator may be adapted to compare the termination voltage with the second reference voltage and output a first signal. The second comparator may be adapted to compare the termination voltage with the third reference voltage and output a second signal. The code selector may be adapted to generate a selection control signal for selecting either the code value at the previous clock cycle or the code value at the current clock cycle based on first and second signals output from the first comparator and second comparator, respectively.

In example embodiments of the present invention, the code selector may further include a first selecting circuit, a second selecting circuit, a logic circuit, a data selection circuit, and a latch circuit. The first selecting circuit may be adapted to receive the first and second signals and output a third signal having one of an active state or a non-active state. The second selecting circuit may be adapted to receive the first and second signals and output a fourth signal having one of an active state and a non-active state. The logic circuit may be adapted to receive the third and fourth signals and output the selection control signal having an active state or a non-active state based on the state of the third signal and the state of the fourth signal. The data selection circuit may be adapted to select one of the delayed code value and the code value from the code generator based on the state of the selection control signal. The latch circuit may be adapted to latch an output of the data selection circuit in response to a load signal to provide the latched output to the impedance adjustment circuit as the code value.

In example embodiments of the present invention, the data selection circuit may further include a multiplexer.

In example embodiments of the present invention, the first selecting circuit may further include a first logic gate, a second logic gate, a third logic gate, and a plurality of delay circuits. The first logic gate may be adapted to perform a logic operation on an inverted first signal and the second signal. The clock delay circuit may delay an output of the first logic gate by at least two clock intervals, and a second logic gate may perform a logic operation on the first signal and an inverted second signal. Another clock delay circuit may delay an output of the second logic gate by a clock interval, and a third logic gate may perform a logic operation on the delayed outputs of the first and second logic gates.

In example embodiments of the present invention, the second selecting circuit may further include, a fourth logic circuit, a fifth logic circuit, a sixth logic circuit, and a plurality of delay circuits. The fourth logic gate may perform a logic operation on the first signal and an inverted second signal, and the clock delay circuit may delay an output of the fourth logic gate by two clock intervals. The fifth logic gate may perform a logic operation on an inverted first signal and the second signal, and another clock delay circuit may delay an output of the fifth logic gate by a clock interval. The sixth logic gate may perform a logic operation on the delayed outputs fourth and fifth logic gates.

In example embodiments of the present invention, the logic circuit may further include a seventh logic gate, an eighth logic gate, and a ninth logic gate. The seventh logic gate may perform a logic operation on an inverted third signal and the fourth signal. The eighth logic gate may perform a logic operation on the third signal and an inverted fourth signal. The ninth logic gate may perform a logic operation on outputs of the seventh and eighth logic gates.

In example embodiments of the present invention, the adjusting may further include designating a first reference voltage, a second reference voltage as an upper threshold of a reference voltage range and a third reference voltage as a lower threshold of the reference voltage range, comparing the first reference voltage with termination voltages at each of a plurality of respective clock cycles, repeatedly selecting one of a plurality of control signals corresponding to the termination voltage at a first clock cycle or the termination voltage at a second clock cycle, based on the a value of the termination voltage relative to the reference voltage, to adjust an impedance value based on the control signal until the termination voltage adjusted by the control signal oscillates with respect to the first reference voltage, and selecting one of the plurality of control signals to adjust the impedance value based on the voltage level of the termination voltage at a third clock cycle and the termination voltage at a fourth clock cycle relative to the second and third reference voltages.

In example embodiments of the present invention, the selected control signal may be one of a control signal corresponding to a termination voltage at a third clock cycle, and a control signal corresponding to a termination voltage at a fourth clock cycle.

BRIEF DESCRIPTION OF THE DRAWINGS

Example embodiments of the present invention will become more apparent by describing, the attached drawings, wherein like elements are represented by like reference numerals.

DETAILED DESCRIPTION OF EXAMPLE EMBODIMENTS OF THE PRESENT INVENTION

Example embodiments of the present invention will become more apparent by describing, in detail, the attached drawings, wherein like elements are represented by like reference numerals, which are given by way of illustration only and thus do not limit the example embodiments of the present invention.

Figure 4:
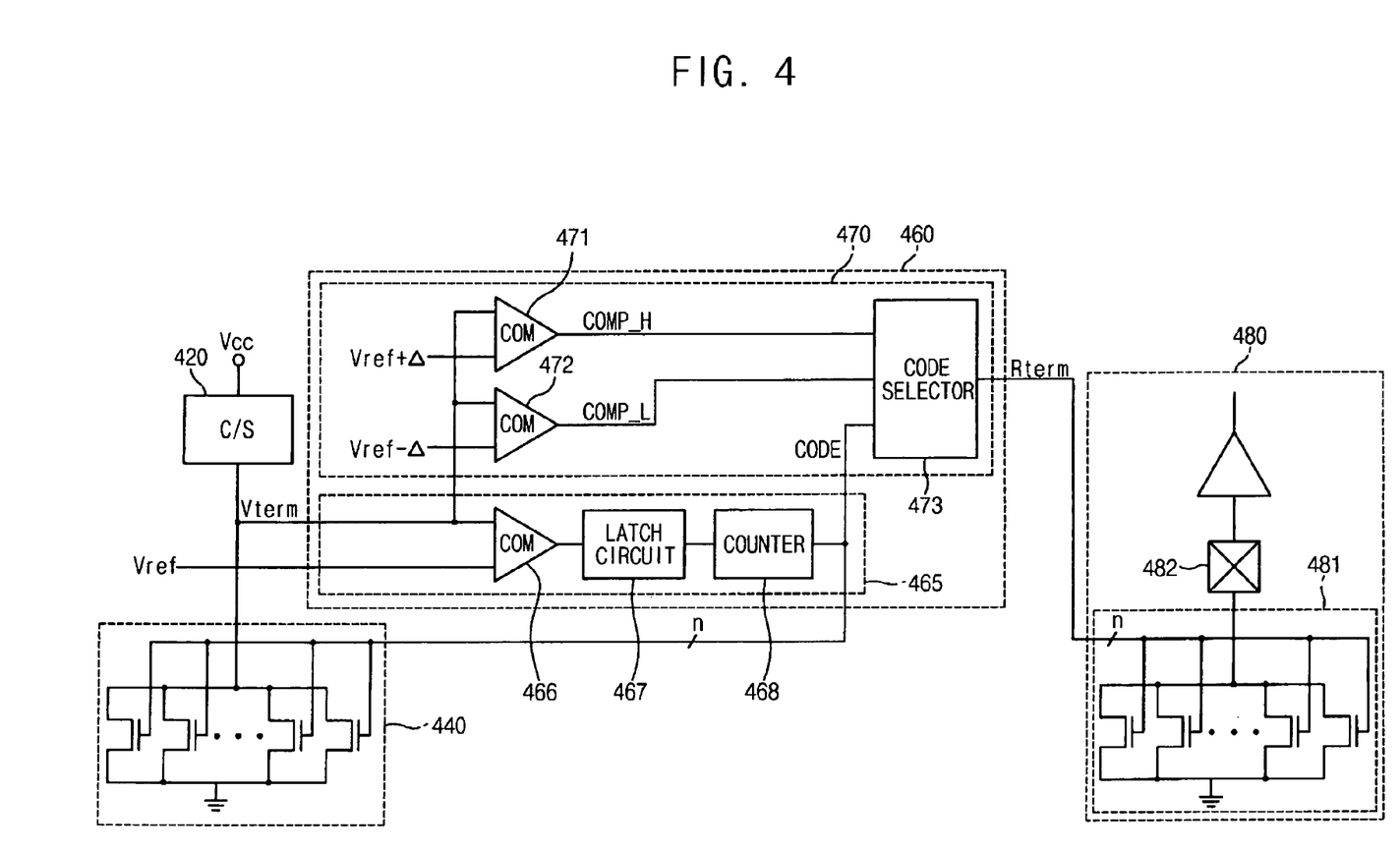
FIG. 4 is a block diagram illustrating an impedance control circuit, according to an example embodiment of the present invention.

FIG. 4 is a block diagram illustrating an impedance control circuit, according to an example embodiment of the present invention.

Referring to FIG. 4, the impedance control circuit, according to an example embodiment of the present invention, may include a current source (C/S) 420, an impedance adjustment circuit 440, and a control signal generation circuit 460.

The current source 420 may be positioned in a semiconductor device and may provide a current (e.g., constant current level) to the semiconductor device.

The impedance adjustment circuit 440 may be connected, (e.g., serially connected) to the current source 420, and may control the current flowing through the current source 420 based on code values CODE such that a node voltage Vterm between the current source 420 and the impedance adjustment circuit 440 may be adjusted. The node voltage Vterm may also be designated as a termination voltage since an adjusted (e.g., a final adjusted) node voltage Vterm may be provided to a termination resistor connected to a transmission medium, for example, a board (e.g., a printed circuit board (PCB) or flexible PCB), any other suitable transmission medium.

The control signal generation circuit 460 may include a code generator 465, and a code selector 470. The control signal generation circuit 460 may further include a delay circuit (not shown).

The code generating section 465 may include a comparator 466, a latch circuit 467 and a counter 468.

The comparator 466 may compare the termination voltage Vterm (e.g., at a feedback impedance of the impedance adjustment circuit 440) with a first reference voltage Vref at a second (e.g., target) impedance. When the Vterm is greater than, or equal to, the first reference voltage Vref, the comparator 466 may output a signal having an active state. When the Vterm is less than the first reference voltage Vref, the comparator 455 may output a signal having a non-active state.

The latch circuit 467 may be used, for example, when the comparator is in an idle state. The latch 467 may store an output of the comparator 466, which may be transmitted to the counter 468.

The counter 468 may generate an n bit binary code (CODE), which may be output to the impedance adjustment circuit 440 and the code selector 473. The n bit binary code (CODE) may be a control signal for the impedance adjustment circuit 440 and the code selector 473. The counter 468 may count the code value by increasing a previous clock by '1', for example, based on a clock signal and the output of the comparator 466 stored in the latch circuit 467. For example, for each clock cycle that a feedback impedance of the impedance adjustment circuit 440 is higher than an impedance corresponding to the first reference voltage, the code value may be increased by '1'. For each clock cycle that the feedback impedance of the impedance adjustment circuit 440 is lower than the impedance corresponding to the first reference voltage, the code value may be decreased by '1'. For example, when a low logic signal 'L' is output from the comparator 466, the termination voltage Vterm may be less than the reference voltage Vref, and the code value stored in the counter 468 may be decreased by '1'.

The current source 420, the impedance adjustment circuit 440, the comparator 466, the latch circuit 467, and the counter 468 may be similar, or substantially similar, in structure and/or function to those described in the related art, however, in example embodiments of the present invention, the impedance adjustment circuit 440 may be a binary weighted circuit and the control signal of the impedance adjustment circuit 440 may be a binary code of any suitable length.

The code selecting section 470 may include comparators 471, 472 and a code selector 473.

The comparator 471 may compare the termination voltage Vterm with a second reference voltage Vref+Δ, and may generate an output signal COMP_H. For example, when the termination voltage Vterm is less than the second reference voltage Vref+Δ, the comparator 471 may output a COMP_H signal having a low logic low level 'L'. In another example, when the termination voltage Vterm is greater than the second reference voltage Vref-Δ, the comparator 471 may output a COMP_H signal having a high logic level 'H'.

The comparator 472 may compare the termination voltage Vterm with a third reference voltage Vref-Δ to generate an output signal COMP_L. For example, when the termination voltage Vterm is less than the third reference voltage Vref-Δ, the comparator 472 may output a COMP_H signal having a low logic level 'L'. In another example, when the termination voltage Vterm is greater than the third reference voltage Vref-Δ, the comparator 472 may output a COMP_H signal having a high logic signal 'H'.

Since the first through third reference voltages may be generated, for example, based on a bandgap reference voltage (e.g., a single bandgap reference voltage), a reference voltage generation circuit (not shown, and which may be included in, for example, the semiconductor device) may occupy a smaller area on the semiconductor device. A method of generating different voltages from a bandgap reference voltage (e.g., a single bandgap reference voltage) is well known and therefore omitted for the sake of clarity.

The code selector 473 may be used to select one of a plurality of code values transmitted from the counter 468. The code selector 473 may select one of the code value at a previous clock cycle and the code value at a current clock cycle, in order to generate a termination voltage Vterm closer to the reference voltage Vref.

The code selector 473 may further include a delay circuit, which may be used to select the code value at the current clock cycle or the code value at the previous clock cycle. The code value at the previous clock cycle may be stored in the delay circuit. The delay circuit may be, for example, a flip-flop or any other suitable delay circuit. The code selector 473 will be described in more detail with regard to FIG. 5.

An output terminal circuit 480 may include a termination resistor 481 and an output pad 482 connected to the termination resistor 481. The termination resistor 481 may be used to suppress signal reflection due to, for example, unequal impedance of the semiconductor device and an external device, etc. The termination resistor 481 may include of a plurality of transistors, which may be operated (e.g., selectively operated) in response to the code value Rterm. The code value Rterm may be provided by the code selector 473, and may be used to adjust an impedance value of the termination resistor 481.

Figure 5:
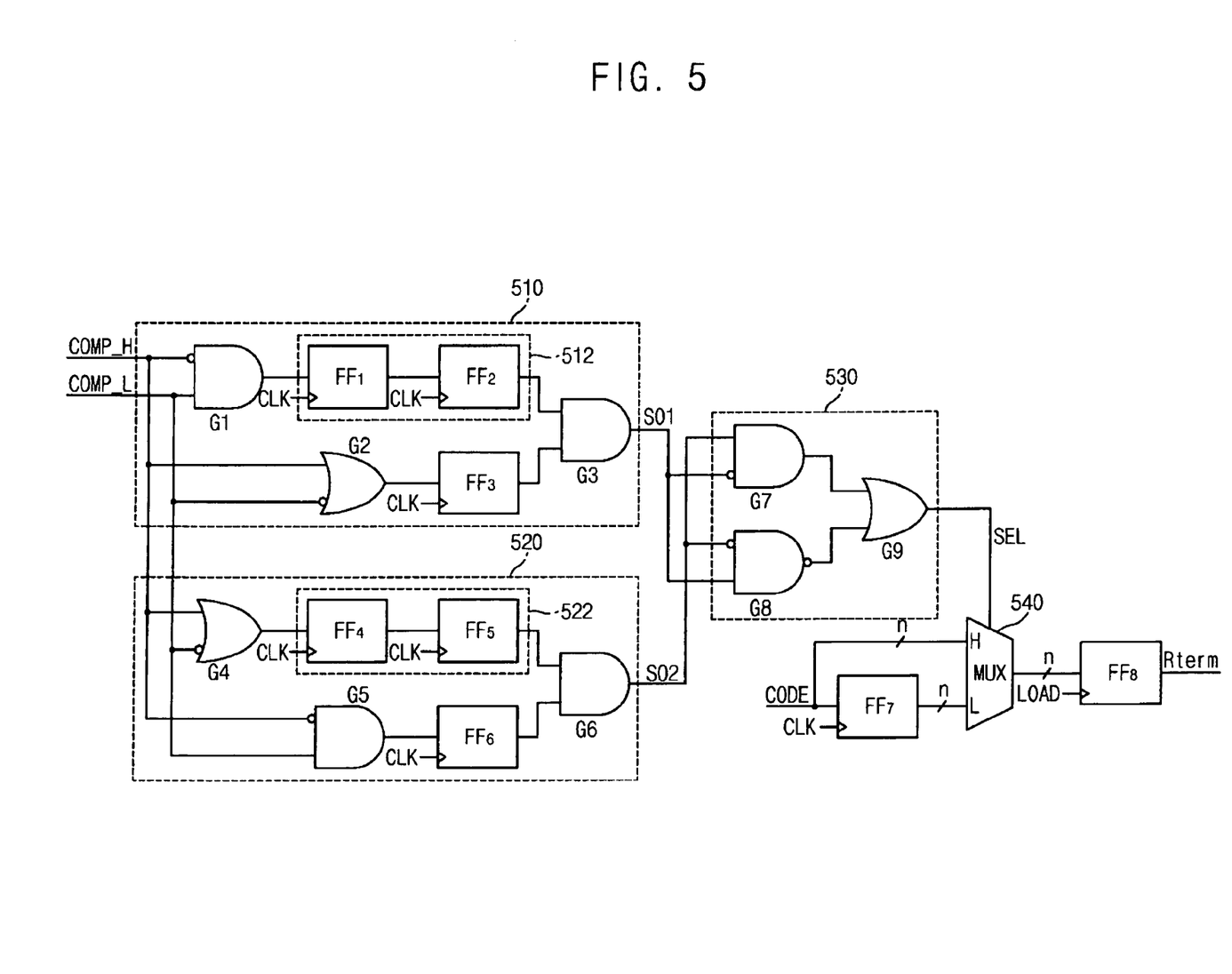
FIG. 5 is a view illustrating a code selector, according to an example embodiment of the present invention.

FIG. 5 illustrates a code selector, according to an example embodiment of the present invention.

Table 1 shows an example function of the code selector 481.

TABLE 1

|  | previous clock cycle | current clock cycle | output code |
|---|---|---|---|
| condition (1) | Vref − Δ < Vterm < Vref + Δ | Vterm > Vref + Δ, or Vterm < Vref − Δ | code value at a previous clock cycle |
| condition (2) | Vterm > Vref + Δ, or Vterm < Vref − Δ | Vref − Δ < Vterm < Vref + Δ | code value at a current clock cycle |

An example operation and configuration of the code selector 473 will be described with reference to FIGS. 4 and 5.

The code selector 473 may include a first selecting circuit 510, a second selecting circuit 520, a logic circuit 530, a data selection logic circuit 540 and flip-flops FF7 and FF8.

The first selecting circuit 510 may include an AND gate G1, a clock delay circuit 512, an OR gate G2, a flip-flop FF3 and an AND gate G3. The AND gate G1 may receive an inverted output COMP_H of the comparator 471 and the output COMP_L of the comparator 472. The clock delay circuit 512 may include a flip-flop FF1 connected to the AND gate G1 and a flip-flop FF2 connected to the flip-flop FF1, and may delay the output of the AND gate G1, for example, by two clock cycles.

The OR gate G2 may receive the output COMP_H of the comparator 471 and an inverted output COMP_L of the comparator 472. The flip-flop FF3 may be connected to the OR gate G2 and may delay the output of the OR gate G2, for example, by one clock cycle. The AND gate G3 may receive outputs of the flipflops FF2 and FF3.

The first selecting circuit 510 may receive outputs COMP_H and COMP_L of the comparators 471 and 472 and when the termination voltage Vterm is between Vref−Δ and Vref+Δ at a previous clock cycle, the first selecting circuit 510 may output a high logic signal 'H' SO1 to the logic circuit 530.

The second selecting circuit 520 may include an OR gate G4, a clock delay circuit 522, an AND gate G5, a flip-flop FF6 and an AND gate G6. The OR gate G4 may receive the output COMP_H of the comparator 471 and an inverted output COMP_L of the comparator 472. The clock delay element 522 may include a flip-flop FF4 connected to the OR gate G4 and a flip-flop FF5 connected to the flip-flop FF4, which may delay the output of the OR gate G4, for example, by two clock cycles. The AND gate G5 may receive an inverted output COMP_H and the output COMP_L. The flip-flop FF6 may be connected to the AND gate G5, and may delay the output of the AND gate G5, for example, by one clock cycle. The AND gate G6 may receive outputs of the flip-flops FF5 and FF6.

The second selecting circuit 520 may receive outputs COMP_H and COMP_L of the comparators 471 and 472. When the termination voltage Vterm is between Vref−Δ and Vref+Δ at a current clock cycle, the second selecting circuit 520 may output a high logic signal 'H' SO2 to the logic circuit 530.

As shown above, the signal SO1 may have a high logic level 'H' and the signal SO2 may have a low logic level 'L' under different conditions. For example, the first and second selecting circuits 510 and 520 may generate SO1 and SO2 signals, respectively, based on the outputs COMP_H and COMP_L from the comparators 471 and 472. The generated SO1 and SO2 signals may be used to select one of a code value at a previous clock cycle or a code value at a current clock cycle, for example, when the termination voltage Vterm is between Vref−Δ and Vref+Δ. The SO1 and SO2 signals may be provided to the logic circuit 530.

The logic circuit 530, according to an example embodiment of the present invention, may include an AND gate G7, a NAND gate G8 and an OR gate G9. The OR gate G9 may receive outputs of the AND gate G7 and the NAND gate G8.

The AND gate G7 may receive an inverted signal SO1 output from the first selecting circuit 510 and the signal SO2 output from the second selecting circuit 520. The NAND gate G8 may receive the signal SO1 output from the first selecting circuit 510 and an inverted signal SO2 output from the second selecting circuit 520. The OR gate G9 may receive outputs of the AND gate G7 and the NAND gate G8.

The logic circuit 530 may receive the signals SO1 and SO2, and may output a signal SEL having a low logic level 'L', for example, when the signal SO1 has a high logic level 'H' and the signal SO2 has a low logic level 'L'. The signal SEL may maintain a high logic level 'H', and the code value at a current clock cycle may be selected, for example, until the termination voltage Vterm, oscillates with respect to the reference voltage Vref. The code value may be increased or decreased by '1', for example, each clock cycle such that it may approach the reference voltage Vref.

The output signal SEL may be transferred to the data selection logic circuit 540.

The flip-flop FF7 may store the code value at a previous clock cycle, and the stored code value, along with the code value at a current clock cycle generated by the counter 468, may be input to the data selection logic circuit 540.

The data selection logic circuit 540 may select the code value at a current clock cycle, for example, when the signal SEL from the logic circuit 530 has a high logic level 'H'. When the signal SEL from the logic circuit 530 has a low logic level 'L', the data selection logic circuit 540 may select the code value at a previous clock cycle, which may be output by the flip-flop FF7. For example, the data selection logic circuit 540 may be a multiplexer MUX.

The flip-flop FF8 may hold the code value Rterm selected by the data selection logic circuit 540 such that the generated termination voltage Vterm may approach the reference voltage. The flip-flop FF8 may transmit the code value Rterm to the output terminal circuit 480, for example, in response to a signal LOAD. The signal LOAD may be similar, or substantially similar to the signal COMPLETE described above with regard to FIG. 1. For example, the signal LOAD may be generated a period of time after the termination voltage Vterm begins to oscillate with respect to the reference voltage Vref.

Figure 6:
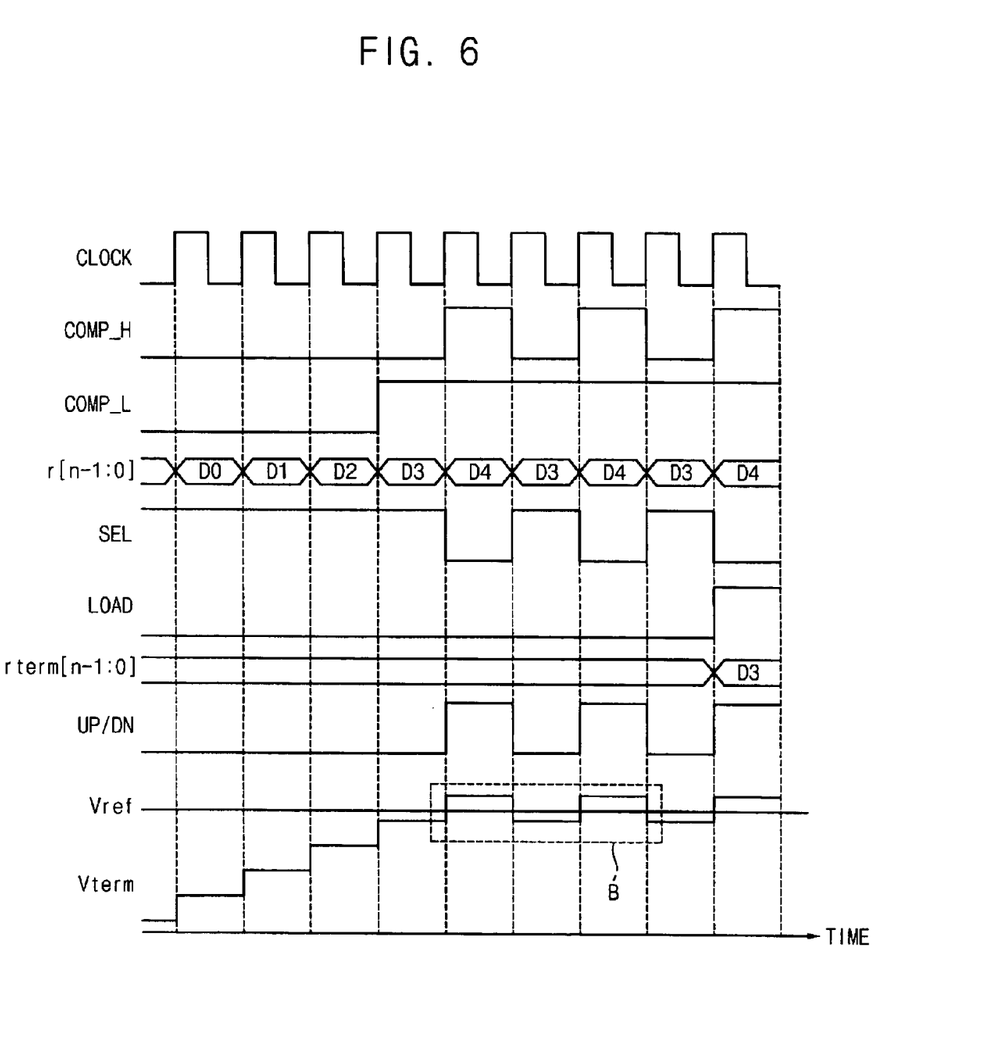
FIG. 6 is a waveform diagram illustrating signals of an impedance control circuit, according to an example embodiment of the present invention.
Figure 7:
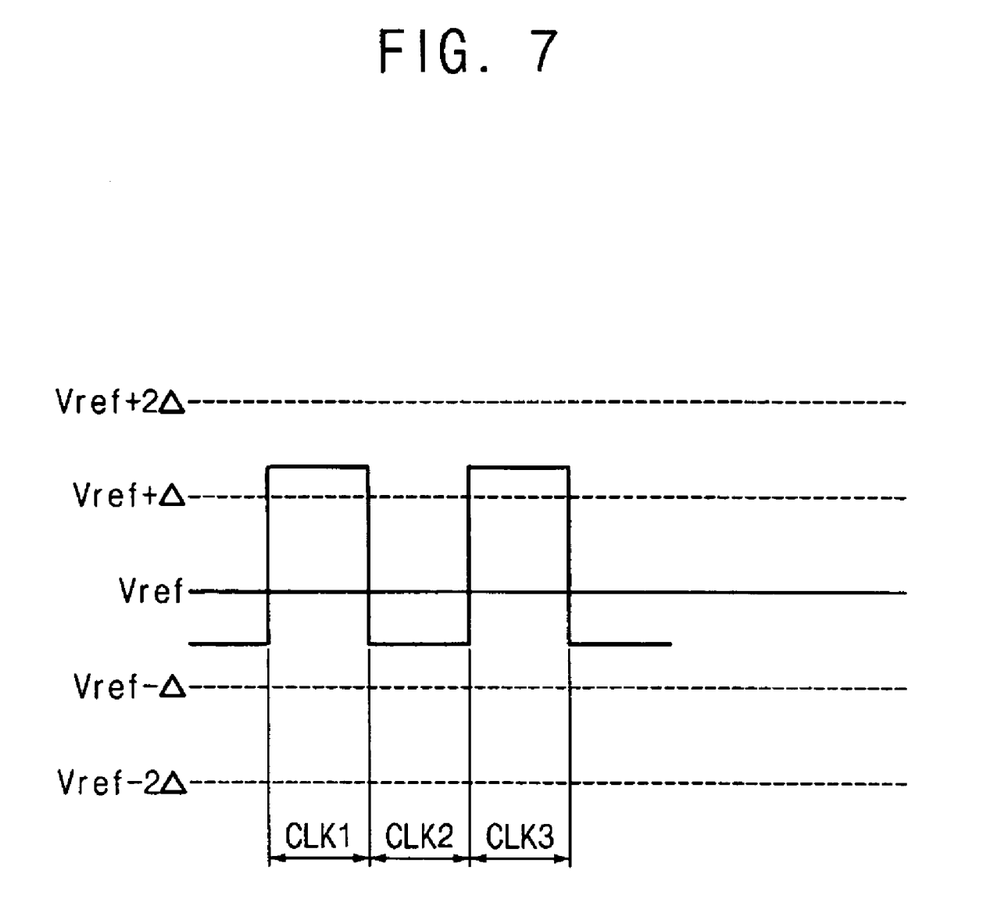
FIG. 7 is a waveform diagram illustrating a partially enlarged portion of B in the waveform diagram of FIG. 6.

FIG. 6 is a waveform diagram illustrating signals of an impedance control circuit and FIG. 7 is a waveform diagram illustrating a partially enlarged portion of B in the waveform diagram of FIG. 6.

Referring to FIGS. 6 and 7, operation of the impedance control circuit, according to an example embodiment of the present invention, will be described.

When the comparator 466 outputs a low logic signal 'L', the Vterm may be less than the first reference voltage Vref, and the code value output from the counter 468 may be decreased by a code value of '1'. This may decrease the number of transistors turned on by 1, which may increase the impedance value of the impedance adjustment circuit 440, and increase the termination voltage Vterm.

Respective gates of the transistors of the impedance adjustment circuit 440 may be controlled by corresponding n bits of the code value r[n−1:0] such that the transistors may be turned on or off according to the code value r[n−1:0]. For example, when the code value r[n−1] decreases, the number of transistors turned on may decrease, the impedance value of the impedance adjustment circuit 440 may increase, and the termination voltage Vterm may increase by a value per clock cycle.

The comparators 471 and 472 may output low logic signals 'L' COMP_H and COMP_L, for example, since the termination voltage Vterm is lower than the Vref+Δ and Vref−Δ.

Repeating the above described operation, the termination voltage Vterm may have a voltage level closer to the reference voltage Vref, and, for example, the termination voltage Vterm may oscillate between a higher level and a lower level of the reference voltage Vref. As shown in the portion B in FIGS. 6 and 7, the termination voltage Vterm may not be symmetrical with respect to the reference voltage Vref due to variations in process, temperature, voltage, etc.

In FIG. 7, the termination voltage Vterm may have a higher level than Vref+Δ, for example, at clock cycles CLK1 and CLK3 and may have a lower level than Vref+Δ at a clock cycle CLK2. In order to select the voltage Vterm closer to the reference voltage Vref, while the voltage levels of the termination voltage Vterm oscillate, the code selector 473 in FIG. 4 may use a method, according to example embodiments of the present invention, as described below.

When the termination voltage Vterm at the clock cycle CLK1 is greater than Vref+Δ and between Vref−Δ and Vref+Δ at clock cycle CLK2, a condition (e.g., condition (2)) in table 1 may be met. The signal COMP_H of the comparator 471 may have a low logic level 'L', for example, since the Vterm may be lower than Vref+Δ at the clock cycle CLK2 and the signal COMP_L of the comparator 472 may have a high logic level 'H', since the Vterm is higher than Vref−Δ. The signals COMP_H and COMP_L may be applied to the code selector 473.

The first selection circuit 510 of the code selector 473 may output the signal SO1 having a low logic level 'L' and the second selecting circuit 520 may output the signal SO2 having a high logic level 'H'. The signals SO1 and SO2 may be transmitted to the logic circuit 530 to generate the signal SEL having a high logic level 'H'. Based on the signal SEL, a code value at a current clock cycle (e.g., clock cycle CLK2) generated by the counter 468 may be selected.

When the termination voltage Vterm at the clock cycle CLK2 is between Vref−Δ and Vref+Δ and is greater than Vref+Δ at the clock cycle CLK3, a condition (e.g., condition (1)) in table 1 may be met. The signals COMP_H and COMP_L output from the comparators 471 and 472 may have high logic levels 'H', since the termination voltage Vterm is higher than Vref+Δ. The signals COMP_H and COMP_L having high logic levels 'H' may be applied to the code selector 473.

The first selecting circuit 510 of the code selector 473 may output the signal SO1 having a high logic level 'H' and the second selecting circuit 520 may output the signal SO2 having a low logic level 'L' to the logic circuit 530. The logic circuit 530 may generate the signal SEL having a low logic level 'L' based on the signals SO1 and SO2, and may transfer the signal SEL to the data selection logic circuit 540. Based on the signal SEL, the code value at a previous clock cycle (e.g., clock cycle CLK2) stored in the flip-flop FF7 may be selected. The code value at the clock cycle CLK2 may be selected in order to generate the termination voltage Vterm closer to the reference voltage Vref.

The code value may be selected based on the signal SEL, which may be a control signal for the data selection logic circuit 540. Since the signal SEL may maintain a higher level to select the code value at a current clock cycle, the code value may increase or decrease each clock cycle until the termination voltage Vterm adjusted by the control signal (e.g., code value) begins to oscillate with respect to the reference voltage Vref.

When the termination voltage Vterm begins to oscillate with respect to the reference voltage Vref, the signal SEL having a high logic level 'H' and the signal SEL having a low logic level 'L' may be generated, for example, repeatedly. The signal LOAD may be generated after a period of time and the code value stored in the flip-flop FF8 may be transferred to the termination resistance 481.

The oscillating termination voltage Vterm may have a plurality of voltage levels (e.g., three voltage levels) due to an offset of the comparator, etc. According to example embodiments of the present invention, the termination voltage Vterm at a first clock cycle and the termination voltage Vterm at a second clock cycle may be compared with the reference voltage Vref, for example, as described above. The termination voltage Vterm closer to the reference voltage Vref may be selected, and the selected termination voltage Vterm may be compared to the reference voltage Vref.

According to example embodiments of the present invention, a feedback impedance value of the impedance adjustment circuit may be compared with a reference voltage range to provide a code value, which may generate a termination voltage Vterm approaching to the reference voltage.

When the oscillating code value provided to the impedance adjustment circuit has a plurality (e.g., three) values, for example, due to an offset of the comparator, etc., a code value may generate a desired impedance.

Example embodiments of the present invention have been described with regard to logic signals logic high 'H', and logic low 'L'. However, it will be understood that any suitable logic signal and/or voltage level may be used. For example, a binary signal '1' or higher voltage level (e.g., +5 volts) may correspond to a logic high signal, and a binary signal '0' or lower voltage level (e.g., 0 volts) may correspond to a logic low signal. It will further be understood that the logic signals and/or voltage levels as described herein are interchangeable, as desired.

Although example embodiments of the present invention have been described with regard to specific logic gates and logic operations, it will be understood that any suitable logic gates and/or logic operations may be used interchangeably.

Although example embodiments of the present invention have been described with regard to specific example embodiments, it will be understood that variations and/or changes that may be made to, for example, the first selecting circuit 510, the second selecting circuit 520, the logic circuit 530, the data selection logic circuit 540, flip-flops FF7 and FF8 or any other circuit, element, etc., of the example embodiments of the present invention, within the scope of the present invention.

Having thus described example embodiments of the present invention, it is to be understood that the appended claims are not to be limited by particular details set forth in the above description of example embodiments of the present invention as many apparent variations thereof are possible without departing from the spirit or scope thereof as hereinafter claimed.

What is claimed is:

1. A circuit for controlling impedance, comprising:
   an impedance adjustment circuit adapted to adjust an impedance value based on a control signal; and
   a control signal generating circuit adapted to determine, at a first clock cycle and a second clock cycle, whether a termination voltage generated based on the impedance value is within a reference voltage range, and adapted to provide, based on a result of the determination, the impedance adjustment circuit with the control signal corresponding to one of an impedance value at the first clock cycle and an impedance value at the second clock cycle that approaches a first impedance value.

2. The circuit of claim 1, wherein the second clock cycle occurs after the first clock cycle.

3. The circuit of claim 1, wherein the control signal generating circuit further includes,
   a code generating circuit adapted to generate a code value based on a comparison of a first reference voltage at the first impedance value and the termination voltage at the adjusted impedance value, and
   a code selecting circuit adapted to select a delayed code value based on a comparison of the termination voltage and a second reference voltage, and the termination voltage and a third reference voltage, wherein
   the code value increases by one for each clock cycle that the termination voltage is higher than the first reference voltage and decreases by one for each clock cycle that the termination voltage is lower than the first reference voltage.

4. The circuit of claim 3, wherein,
   the second and third reference voltages are an upper threshold and a lower threshold, respectively, of the reference voltage range,
   the code selecting circuit selects the delayed code value when the termination voltage at a previous clock cycle is within the reference voltage range and the termination voltage at a current clock cycle is out of the reference voltage range.

5. The circuit of claim 3, wherein,
the second and third reference voltages are an upper threshold and a lower threshold, respectively, of the reference voltage range, and
the code selecting circuit selects the code value from the code generation circuit when the termination voltage at the previous clock cycle is out of the reference voltage range and the termination voltage at the current clock cycle is within the reference voltage range.

6. The circuit of claim 3, wherein the code generating circuit further includes,
a first comparator adapted to compare the termination voltage with the first reference voltage,
a latch circuit configured to latch an output of the first comparator, and
a counter adapted to increase the code value by one when the termination voltage is higher than the first reference voltage and decrease the code value by one when the termination voltage is lower than the first reference voltage.

7. The circuit of claim 3, wherein the code selecting circuit further includes,
a first comparator adapted to compare the termination voltage with the second reference voltage and output a first signal,
a second comparator adapted to compare the termination voltage with the third reference voltage and output a second signal, and
a code selector adapted to generate a selection control signal for selecting either the code value at the previous clock cycle or the code value at the current clock cycle based on the first and second signals output from the first comparator and second comparator, respectively.

8. The circuit of claim 7, wherein the code selector further includes,
a first selecting circuit adapted to receive the first and second signals and output a third signal having one of an active state or a non-active state,
a second selecting circuit adapted to receive the first and second signals and output a fourth signal having one of an active state and a non-active state,
a logic circuit adapted to receive the third and fourth signals and output the selection control signal having an active state or a non-active state based on the state of the third signal and the state of the fourth signal,
a data selection circuit adapted to select one of the delayed code value and the code value from the code generator based on the state of the selection control signal, and
a latch circuit adapted to latch an output of the data selection circuit in response to a load signal to provide the latched output to the impedance adjustment circuit as the code value.

9. The circuit of claim 8, wherein the data selection circuit further includes a multiplexer.

10. The circuit of claim 8, wherein the first selecting circuit further includes,
a first logic gate adapted to perform a logic operation on an inverted first signal and the second signal,
a clock delay circuit adapted to delay an output of the first logic gate by at least two clock intervals,
a second logic gate adapted to perform a logic operation on the first signal and an inverted second signal,
a clock delay circuit adapted to delay an output of the second logic gate by a clock interval, and
a third logic gate adapted to perform a logic operation on the delayed outputs of the first and second logic gates.

11. The circuit of claim 8, wherein the second selecting circuit further includes,
a fourth logic gate adapted to perform a logic operation on the first signal and an inverted second signal,
a clock delay circuit adapted to delay an output of the fourth logic gate by two clock intervals,
a fifth logic gate adapted to perform a logic operation on an inverted first signal and the second signal,
a clock delay circuit adapted to delay an output of the fifth logic gate by a clock interval, and
a sixth logic gate adapted to perform a logic operation on the delayed outputs of the fourth and fifth logic gates.

12. The circuit of claim 8, wherein the logic circuit further includes,
a seventh logic gate for performing a logic operation on an inverted third signal and the fourth signal,
an eighth logic gate for performing a logic operation on the third signal and an inverted fourth signal, and
a ninth logic gate for performing a logic operation on outputs of the seventh and eighth logic gates.

13. A method of controlling impedance, the method comprising:
adjusting an impedance value in response to a control signal, which is based on an oscillation of a termination voltage at the adjusted impedance value relative to a reference voltage range at a previous clock cycle and a current clock cycle.

14. The method of claim 13, wherein the adjusting further includes,
designating a first reference voltage, a second reference voltage as an upper threshold of the reference voltage range and a third reference voltage as a lower threshold of the reference voltage range,
comparing the first reference voltage with termination voltages at each of a plurality of respective clock cycles,
repeatedly selecting one of a plurality of control signals corresponding to the termination voltage at a first clock cycle or the termination voltage at a second clock cycle, based on the a value of the termination voltage relative to the first reference voltage, to adjust an impedance value based on the control signal until the termination voltage adjusted by the control signal oscillates with respect to the first reference voltage; and
selecting one of the plurality of control signals to adjust the impedance value based on the voltage level of the termination voltage at a third clock cycle and the termination voltage at a fourth clock cycle relative to the second and third reference voltages.

15. The method of claim 14, wherein the selected control signal is one of a control signal corresponding to a termination voltage at a third clock cycle, and a control signal corresponding to a termination voltage at a fourth clock cycle.

16. A control circuit comprising:
a code generating section adapted to compare a first reference voltage at a first impedance value with a termination voltage at an impedance value adjusted by a control signal to generate a code value corresponding to the control signal;
a delay circuit adapted to delay the code value generated from the code generating section by one clock cycle; and a code selecting circuit adapted to select the delayed code based on a comparison of the termination voltage with a second reference voltage and a third reference voltage; wherein the code value increases by one for each clock cycle that the termination voltage is higher than the first reference voltage and decreases by one for each clock cycle that the termination voltage is lower than the first reference voltage.

17. A code selector for use in an impedance control circuit, the code selector comprising:

a first selecting circuit adapted to receive a first and second control signal and output a first selection signal;

a second selecting circuit adapted to receive the first and second control signals and output a second selection signal; and a logic circuit adapted to receive the first and second selection signals and output a code selection signal; wherein the code selection signal is used to select one of a previous code signal and a current code signal such that a selected code signal is used to provide a target impedance value of a semiconductor device.

18. A control circuit including the code selector of claim 17.

19. An impedance control circuit including the control circuit of claim 18.

20. An impedance control circuit for performing the method of claim 13.

* * * * *